United States Patent [19]

Yokoyama

[11] 4,290,024
[45] Sep. 15, 1981

[54] VOLTAGE-TO-CURRENT CONVERTER CIRCUIT

[75] Inventor: Kenji Yokoyama, Hamamatsu, Japan

[73] Assignee: Nippon Gakki Seizo Kabushiki Kaisha, Hamamatsu, Japan

[21] Appl. No.: 136,448

[22] Filed: Apr. 2, 1980

[30] Foreign Application Priority Data

Apr. 13, 1979 [JP] Japan .................. 54-44961

[51] Int. Cl.³ .............................................. H03F 1/26
[52] U.S. Cl. ........................................ 330/85; 179/1 F;
330/105
[58] Field of Search .............. 323/4, 16, 40; 179/1 F;
307/264, 350, 359; 330/85, 105, 109

[56] References Cited

U.S. PATENT DOCUMENTS

| | | | |
|---|---|---|---|
| 3,440,518 | 4/1969 | Cliffgard et al. | 323/16 X |
| 3,826,969 | 7/1974 | Eichelberger et al. | 323/40 X |
| 3,870,896 | 3/1975 | Kiko | 323/4 X |
| 4,092,494 | 5/1978 | Micheron | 179/1 F |
| 4,223,273 | 9/1980 | Yokoyama | 330/85 |

FOREIGN PATENT DOCUMENTS

| | | | |
|---|---|---|---|
| 2235664 | 1/1974 | Fed. Rep. of Germany | 179/1 F |
| 2846381 | 5/1979 | Fed. Rep. of Germany | 330/105 |

Primary Examiner—A. D. Pellinen
Attorney, Agent, or Firm—Frishauf, Holtz, Goodman & Woodward

[57] ABSTRACT

A voltage-to-current converter circuit comprises first and second amplifiers each having a noninverting input, an inverting input and an output, the noninverting inputs of the first and second amplifiers being respectively connected to an input terminal for receiving an input signal and circuit ground, a first impedance element connected between the inverting input of the first amplifier and circuit ground, a second impedance element connected between the output and the inverting input of the first amplifier, a third impedance element connected between the output of the i first amplifier and an output terminal to be connected to a load, a fourth impedance element connected between the inverting input of the second amplifier and the output terminal, a fifth impedance element connected between the output and the inverting input of the second amplifier, and a sixth impedance element connected between the output of second amplifier and the inverting input of first amplifier. When the second to sixth impedance elements are selected to have respective impedance values $Z_2$ to $Z_6$ which satisfy an equation $$1 + \frac{Z_3}{Z_4} - \frac{Z_2 \cdot Z_5}{Z_6 \cdot Z_4} = 0$$

the voltage-to-current converter circuit operates as a constant current amplifier which is capable of supplying the load with an output current signal of a constant amplitude when the input signal voltage is constant, regardless of the impedance value of the load.

7 Claims, 5 Drawing Figures

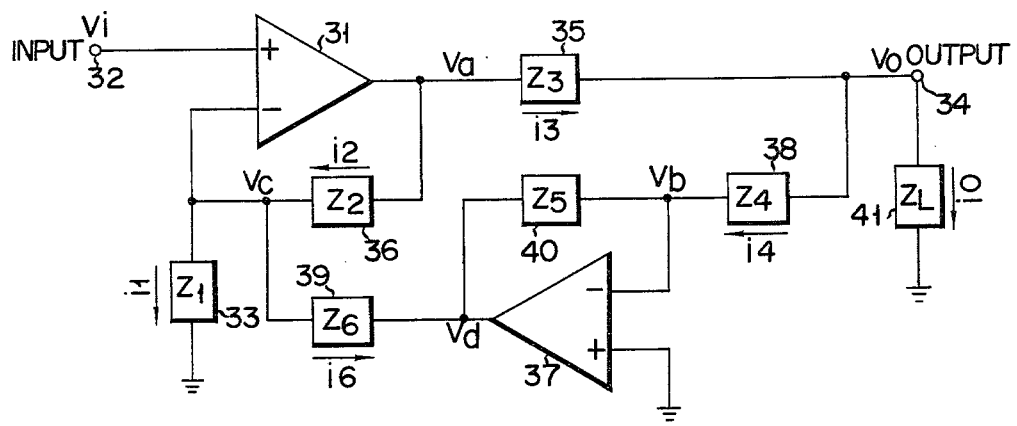
F I G. 4
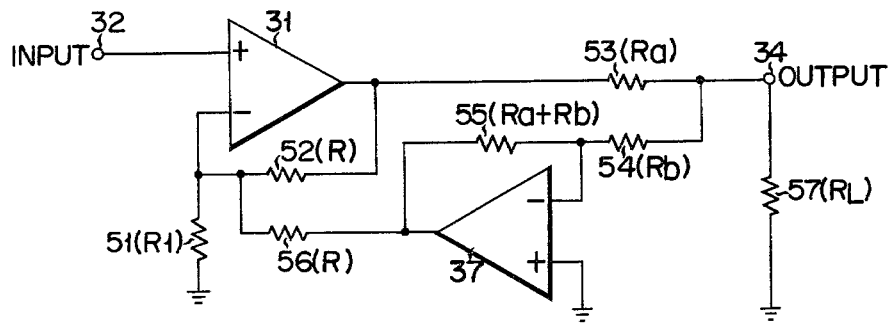
F I G. 5

VOLTAGE-TO-CURRENT CONVERTER CIRCUIT

BACKGROUND OF THE INVENTION

This invention relates to a voltage-to-current converter circuit, and, more particularly, to a voltage-to-current converter circuit suited for use as a constant current amplifier capable of driving a load by a constant signal current when the amplitude of an input signal is constant, regardless of value of the load.

Prior art voltage-to-current converter circuits will be described, by way of examples, with reference to FIGS. 1 to 3. In the circuit of FIG. 1, an operational amplifier 1 has its noninverting input connected to an input terminal 2 and its inverting input connected to circuit ground through a resistor 3 of a resistance value $R_{11}$, and a load 4 of an impedance value $Z_{L1}$ is connected between the output and inverting input of the operational amplifier 1.

When an input signal of voltage $v_{i1}$ is applied between the input terminal 2 and circuit ground, output voltage $v_{01}$ appearing between the output terminal 5 and circuit ground is given by $$v_{01} = \left(1 + \frac{Z_{L1}}{R_{11}}\right) v_{i1} \quad (1)$$

$$v_{01} = i_{01}(Z_{L1} + R_{11}) \quad (2)$$

where $i_{01}$ represents current flowing through the load 4. Eliminating $v_{01}$ from equations (1) and (2) and rearranging yields $$i_{01} = \frac{1}{R_{11}} v_{i1} \quad (3)$$

Namely, the load current $i_{01}$ is proportional to the input voltage $v_{i1}$. However, the circuit of FIG. 1 is very difficult to use in designing circuits because the load is floated with respect to circuit ground.

In the circuit of FIG. 2, an operational amplifier 7 has its inverting input connected to an input terminal 8 through a resistor 9 (value $R_{21}$), its noninverting input to circuit ground through a resistor 11 (value $R_{23}$) and its output to its inverting input through a resistor 10 (value $R_{22}$) and to its noninverting input through series connected resistors 12 (value $R_{24}$) and 13 (value $R_{25}$). A load 15 of impedance value $Z_{L2}$ is connected between an output terminal 14 connected to a connection point of the resistors 12 and 13 and circuit ground. When an input signal of voltage $v_{i2}$ is applied to the input terminal 8 load current $i_{02}$ is represented by $$i_{02} = \frac{-R_{22}(R_{23} + R_{25})}{Z_{L2} \cdot X_1 + R_{21} \cdot R_{24}(R_{23} + R_{25})} \cdot v_{i2} \quad (4)$$

where $X_1 = R_{21}(R_{23} + R_{25} + R_{24}) - R_{23}(R_{21} + R_{22})$. When $X_1 = 0$ or $$\frac{R_{22}}{R_{21}} = \frac{R_{25} + R_{24}}{R_{23}}$$

in equation (4), it will be seen that the load current $i_{02}$ is proportional to the input voltage $v_{i2}$ and does not depend on the load impedance $Z_{L2}$. Although one terminal of the load 15 can be grounded, the circuit of FIG. 2 has a drawback that the input impedance is low because the operational amplifier 7 is used as an inverting amplifier. This drawback is eliminated by provision of an operational amplifier used as noninverting amplifier at the input side of the circuit of FIG. 2 as shown in FIG. 3.

In the circuit of FIG. 3, an operational amplifier 18 has its noninverting input connected to an input terminal 17 and its output connected to its inverting input through a resistor 19 ($R_{31}$), and an operational amplifier 21 has its inverting input connected to the output of the operational amplifier 18 through a resistor 20 ($R_{32}$), its noninverting input grounded and its output connected to its inverting input through a resistor 22 ($R_{33}$) and to the inverting input of operational amplifier 18 through series-connected resistors 23 ($R_{34}$) and 25 ($R_{35}$). A load 26 ($Z_{L3}$) is connected between an output terminal 24 connected to a connection point of the resistors 23 and 25 and circuit ground. When, in the circuit of FIG. 3, an input signal of voltage $v_{i3}$ is applied to the input terminal 17, the load current $i_{03}$ flowing through the load 26 is represented as follows:

$$i_{03} = \frac{\frac{R_{34}}{R_{35}} - \frac{R_{33}}{R_{32}}\left(1 + \frac{R_{31}}{R_{35}}\right)}{R_{34} + Z_{L3} \cdot X_2} \cdot v_{i3} \quad (5)$$

where $X_2 = 1 + \frac{R_{34}}{R_{35}} - \frac{R_{33} \cdot R_{31}}{R_{35} \cdot R_{32}}$.

When $X_2 = 0$, therefore, the load current $i_{03}$ is proportional to the input signal voltage $v_{i3}$ and does not depend on the load impedance $Z_{L3}$. With the circuit of FIG. 3, although the input impedance is made high by provision of the noninverting amplifier 18, the output voltage signal is opposite in phase to the input voltage signal and the signal-to-noise ratio is deteriorated as compared with the circuit of FIG. 2 because of addition of the amplifier 18 having active devices. Generally, a circuit in which an output signal is in phase with an input signal is easy to use in designing circuits.

SUMMARY OF THE INVENTION

It is an object of this invention to provide an improved voltage-to-current converter circuit which enables one terminal of a load to be grounded and an output signal substantially in phase with an input signal to be produced, and has a relatively high input impedance.

Another object of this invention is to provide a constant-current amplifier which is simple in construction and enables to supply a load having one terminal grounded with a signal current of a constant amplitude when the amplitude of an input signal is constant, regardless of impedance value of the load.

A voltage-to-current converter circuit embodying this invention is responsive to application of an input voltage signal between an input terminal and circuit ground to supply an output current signal to a load connected between an output terminal and circuit ground and comprises first and second amplifiers each having a noninverting input, an inverting input and an output, the noninverting inputs of the first and second amplifiers being coupled to the input terminal and circuit ground, respectively; a first impedance element connected between the inverting input of the first amplifier and circuit ground; a second impedance element connected between the output and the inverting input of the first amplifier; a third impedance element connected between the output of the first amplifier and an output terminal; a fourth impedance element connected between the inverting input of the second amplifier and the output terminal; a fifth impedance element connected between the inverting input and the output of the second amplifier; and a sixth impedance element connected between the output of the second amplifier and the inverting input of the first amplifier.

If the second to sixth impedance elements are selected to have impedance values $Z_2$ to $Z_6$, respectively, which satisfy an equation $$1 + \frac{Z_3}{Z_4} - \frac{Z_2 \cdot Z_5}{Z_6 \cdot Z_4} = 0$$

then, the voltage-to-current converter circuit operates as a constant-current amplifier which has an infinite output impedance and supplies the load with the output current signal of a constant amplitude when the amplitude of the input voltage signal is constant.

BRIEF DESCRIPTION OF THE DRAWINGS

FIG. 4 is a circuit diagram of a voltage-to-current converter circuit embodying this invention; and FIG. 5 is a practical circuit diagram of the voltage-to-current converter circuit of FIG. 4 when used as a constant-current amplifier.

BRIEF DESCRIPTION OF THE PREFERRED EMBODIMENT

Figure 1:
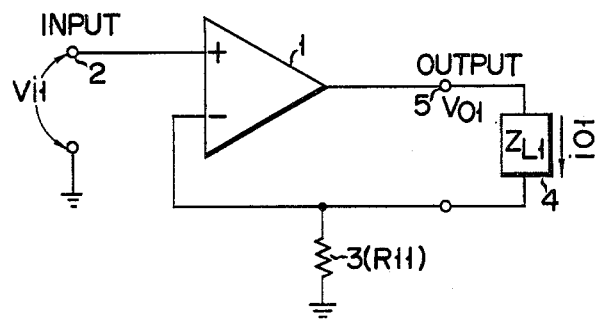
FIGS. 1 to 3 are circuit diagrams of prior art voltage-to-current converter circuits.
Figure 2:
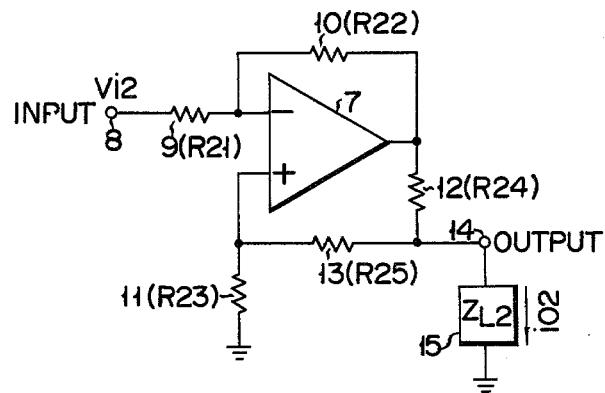
Figure 3:
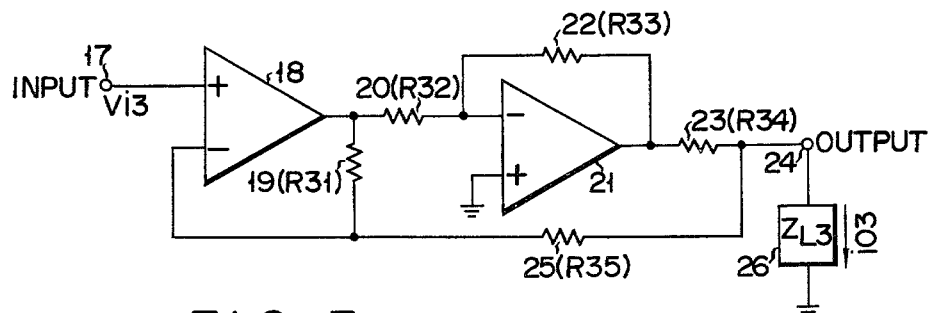

In a voltage-to-current converter circuit shown in FIG. 4, a first operational amplifier 31 has its noninverting input connected to an input terminal 32 to receive an input voltage signal, its inverting input connected to circuit ground through an impedance element 33 having an impedance value of $Z_1$, and its output connected to an output terminal 34, to which a load is to be connected, through an impedance element 35 having an impedance value of $Z_3$. An impedance element 36 having an impedance value of $Z_2$ is connected between the output and the inverting input of operational amplifier 31. A second operational amplifier 37 has its noninverting input connected to circuit ground, its inverting input connected to the output terminal 34 through an impedance element 38 having an impedance value of $Z_4$, and its output connected to the inverting input of the first operational amplifier 31 through an impedance element 39 having an impedance value of $Z_6$. An impedance element 40 having an impedance value of $Z_5$ is connected between the inverting input and the output of the second operational amplifier 37. A load 41 having an impedance value of $Z_L$ is connected between the output terminal 34 and circuit ground.

In the circuit configured as shown in FIG. 4, assuming that currents flowing through the impedance elements 33, 36, 35, 38 and 39, and the load 41 in the directions as indicated by arrows are $i_1$, $i_2$, $i_3$, $i_4$, $i_6$ and $i_0$, respectively, and input voltage applied to the input terminal 32, output voltage of the first operational amplifier 31, voltage at the inverting input of the second operational amplifier 37, voltage at the inverting input of the first operational amplifier 31, output voltage of the second operational amplifier 37, and output voltage at the output terminal 34 are $v_i$, $v_a$, $v_b$, $v_c$, $v_d$ and $v_0$, respectively, following equations hold $$v_0 = Z_L \cdot i_0 \qquad (6)$$

$$i_4 = \frac{v_0 - v_b}{Z_4} \qquad (7)$$

$$i_3 = i_4 + i_0 \qquad (8)$$

Since $v_b = 0$, substituting equation (6) into equation (7) yields $$i_4 = \frac{Z_L \cdot i_0}{Z_4} \qquad (9)$$

Substituting equation (9) into equation (8) yields $$i_3 = \frac{Z_L \cdot i_0}{Z_4} + i_0 \qquad (10)$$

Accordingly, the output voltage $v_a$ of the first operational amplifier 31 can be found by $$v_a = Z_3 \cdot i_3 + v_0 = Z_3 \left( \frac{Z_L \cdot i_0}{Z_4} + i_0 \right) Z_L \cdot i_0 \qquad (11)$$

The output voltage $v_a$ of the first operational amplifier 31 may also be found in the following manner. The current $i_2$ is given by $$i_2 = i_1 + i_6 \qquad (12)$$

Since $v_c = v_1$ the current $i_1$ is $$i_1 = \frac{v_c}{Z_1} = \frac{v_i}{Z_1} \qquad (13)$$

Since the current flowing through the impedance element 40 is $i_4$, the output voltage $v_d$ of the second operational amplifier 37 is $$v_d = -Z_5 \cdot i_4 \qquad (14)$$

Substituting equation (9) into equation (14), $$v_d = -\frac{Z_5 \cdot Z_L}{Z_4} i_0 \qquad (15)$$

Accordingly, the current $i_6$ is given by $$i_6 = \frac{v_c - v_d}{Z_6} = \frac{v_i + \frac{Z_5 \cdot Z_L}{Z_4} \cdot i_0}{Z_6} \qquad (16)$$

Substituting equations (13) and (16) into equation (12) yields $$i_2 = \frac{v_i}{Z_1} + \frac{v_i + \frac{Z_5 \cdot Z_L}{Z_4} \cdot i_0}{Z_6} \qquad (17)$$

Thus, the output voltage $v_a$ can be found by $$v_a = v_c + Z_2 \cdot i_2 = v_i + Z_2 \left( \frac{v_i}{Z_1} + \frac{v_i + \frac{Z_5 \cdot Z_L}{Z_4} \cdot i_0}{Z_6} \right) \qquad (18)$$

Therefore, from equations (11) and (18) the following equation is obtained $$v_a = Z_3\left(\frac{Z_L \cdot i_0}{Z_4} + i_0\right) + Z_L \cdot i_0 \qquad (19)$$

$$= v_i + Z_2\left(\frac{v_i}{Z_1} + \frac{v_i + \frac{Z_5 \cdot Z_L}{Z_4} \cdot i_0}{Z_6}\right)$$

Rearranging equation (19) yields $$v_i\left(1 + \frac{Z_2}{Z_1} + \frac{Z_2}{Z_6}\right) = \qquad (20)$$

$$i_0\left\{Z_3 + Z_L\left(1 + \frac{Z_3}{Z_4} - \frac{Z_2 \cdot Z_5}{Z_6 \cdot Z_4}\right)\right\}$$

From equation (20) the mutual conductance $g_m$ of the circuit of FIG. 4 is found by $$g_m = \frac{1 + \frac{Z_2}{Z_1} + \frac{Z_2}{Z_6}}{Z_3 + Z_L\left(1 + \frac{Z_3}{Z_4} - \frac{Z_2 \cdot Z_5}{Z_6 \cdot Z_4}\right)} \qquad (21)$$

As will be evident from equation (20), in the circuit of FIG. 4, the output current $i_0$ is proportional to the input voltage $v_i$ when the load impedance $Z_L$ is constant, and the output current $i_0$ is zero when the input voltage $v_i$ is zero, enabling one terminal of the load 41 to be grounded. Since the input terminal 32 is connected to the noninverting input of the operational amplifier 31 the input impedance of the circuit of FIG. 4 is very high. Further, the output voltage signal $v_0$ appearing at the output terminal 34 is in phase with the input voltage signal $v_i$ applied to the input terminal 32.

The signal-to-noise ratio of the circuit of FIG. 4 is determined by the impedance value $Z_1$ of the impedance element 33 connected between the inverting input of the first operational amplifier 31 and circuit ground. As will be understood from equation (20), the impedance value $Z_1$ can be made small while maintaing $Z_2/Z_1$ constant. Namely, the signal-to-noise ratio can be made high.

Next, there will be described selection of impedance values of the impedance elements such that the coefficient of the load impedance $Z_L$ in equations (20) and (21) becomes zero. In this case, $$1 + \frac{Z_3}{Z_4} - \frac{Z_2 \cdot Z_5}{Z_6 \cdot Z_4} = 0 \qquad (22)$$

Under this condition, the mutual conductance $g_m$ is independent of the load impedance $Z_L$, and the output current $i_0$ depends only on the input voltage $v_i$. In other words, the circuit has infinite output impedance and operates as a constant-current amplifier capable of supplying the load with a constant signal current if the input voltage is constant. Such a constant-current amplifier is very suited for a recording amplifier in tape recorders.

For constant-current operation, when $Z_2 = Z_6 = Z$, for example, the following equation may be derived from equation (22)

$$Z_3 + Z_4 = Z_5 \qquad (23)$$

At this time, the mutual conductance $g_m$ is found by $$g_m = \frac{2 + \frac{Z}{Z_1}}{Z_3} \qquad (24)$$

On the other hand, when $Z_5 = Z_6 = Z$, the following relation is derived from equation (22) for constant-current operation $$Z_3 + Z_4 = Z_2 \qquad (25)$$

At this time, the mutual conductance $g_m$ is $$g_m = \frac{1 + 2\frac{Z_2}{Z}}{Z_3} \qquad (26)$$

In addition to the above-mentioned advantages, the circuit of FIG. 4 has, when it is used as a constant-current amplifier, the following advantages. First, when a nonlinear resistance such as contact resistance of a connector, a diode and the like the resistance of which varies with applied voltage is connected between the constant-current amplifier and the load, distortion of signal voltage across the load does not occur even if the nonlinear resistance changes. Second, since the circuit has infinite output impedance when the load is driven in the constant-current manner, noise current does not flow into the load circuit such as a recording head even when the load circuit receives noise electromagnetic waves.

FIG. 5 shows a practical circuit diagram of the circuit of FIG. 4 in which the impedance elements 33, 36, 35, 38, 40, 39 are replaced by resistors 51 to 56, respectively. As shown, since the resistors 52 and 56 are selected to have an equal resistance value of R, and the resistors 53 to 55 are selected to have resistance values $R_a$, $R_b$ and $R_a + R_b$, respectively the circuit of FIG. 5 operates as a constant-current amplifier.

In the circuit of FIG. 5, the resistor 51 is shown as having a resistance value of $R_1$ and a load resistance 57 a resistance value of $R_L$.

The mutual conductance $g_m$ is $$g_m = \frac{2 + \frac{R}{R_1}}{R_a}$$

Therefore, when $R_a = 100$ ohms, $R_b = 1$ kilohms, $R_1 = 1$ kilohms and $R = 8$ kilohms, the mutual conductance $g_m$ is 0.1 mho. In this case, when $R_L = 1$ kilohms the circuit gain A is found by $$A_v = g_m \cdot R_L = 0.1 \times 1,000 = 100 (40 \text{ dB}).$$

What is claimed is:

1. A voltage-to-current converter circuit for proportionally converting an A.C. input voltage into an A.C. output current, and having a high input impedance, comprising:
a first amplifier having a noninverting input connected to receive an A.C. input voltage signal, an inverting input and an output;

a first impedance element connected between said inverting input of said first amplifier and circuit ground;

a second impedance element connected between said output and said inverting input of said first amplifier;

an output terminal for supplying an A.C. output current to a load which is connected between said output terminal and circuit ground;

a third impedance element connected between said output of said first amplifier and said output terminal;

a second amplifier having a noninverting input connected to circuit ground, an inverting input and an output;

a fourth impedance element connected between said inverting input of said second amplifier and said output terminal;

a fifth impedance element connected between said inverting input and said output of said second amplifier; and a sixth impedance element connected between said output of said second amplifier and said inverting input of said first amplifier;

whereby an A.C. output current proportional to and in phase with said A.C. input voltage is supplied to a load which is connected between said output terminal and circuit ground.

2. The voltage-to-current converter circuit according to claim 1 wherein said second to sixth impedance elements have impedance values $Z_2$, $Z_3$, $Z_4$, $Z_5$ and $Z_6$, respectively, which satisfy the following equation $$1 + \frac{Z_3}{Z_4} - \frac{Z_2 \cdot Z_5}{Z_6 \cdot Z_4} = 0$$

3. The voltage-to-current converter circuit according to claim 2 wherein $Z_2 = Z_6$, $Z_3 + Z_4 = Z_5$.

4. The voltage-to-current converter circuit according to claim 2 wherein $Z_5 = Z_6$, $Z_3 + Z_4 = Z_2$.

5. The voltage-to-current converter circuit according to anyone of claims 1 to 4 wherein each impedance element is a resistor.

6. The voltage-to-current converter circuit according to claim 1 wherein said first amplifier is an operational amplifier.

7. The voltage-to-current converter according to claim 1 or claim 6, wherein said second amplifier is an operational amplifier.

* * * * *